United States Patent [19]
Eldridge

[11] Patent Number: 5,911,864
[45] Date of Patent: Jun. 15, 1999

[54] METHOD OF FABRICATING A SEMICONDUCTOR STRUCTURE

[75] Inventor: Graeme W. Eldridge, Murrysville, Pa.

[73] Assignee: Northrop Grumman Corporation, Los Angeles, Calif.

[21] Appl. No.: 08/745,984

[22] Filed: Nov. 8, 1996

[51] Int. Cl.$^6$ ........................................................ C25F 3/12
[52] U.S. Cl. ........................ 205/124; 205/210; 205/219; 205/674; 205/684; 205/686
[58] Field of Search ...................... 205/656, 124, 205/210, 219, 684, 686, 662; 216/2

[56] References Cited

U.S. PATENT DOCUMENTS

| | | | |
|---|---|---|---|
| 3,078,219 | 2/1963 | Chang | 205/684 X |
| 3,230,160 | 1/1966 | Kennedy | 205/684 |
| 4,194,954 | 3/1980 | Faktor et al. | 205/684 X |
| 4,462,856 | 7/1984 | Abe et al. | |
| 5,110,428 | 5/1992 | Prigge et al. | 205/656 X |

FOREIGN PATENT DOCUMENTS

| | | |
|---|---|---|
| 1446067 | 1/1969 | Germany . |
| 1045515 | 10/1966 | United Kingdom . |

OTHER PUBLICATIONS

"Chemical Behavior of Semiconductors: Etching Characteristics", by H.C. Gatos, M.C. Lavine, Technical Report, Massachusetts Institute of Technology, Lincoln Laboratory, Jan. 2, 1963.

*Primary Examiner*—Donald R. Valentine
*Attorney, Agent, or Firm*—Walter G. Sutcliff

[57] ABSTRACT

The present invention provides for a wet etch and method for preparing a semiconductor device structure from a silicon carbide wafer. A first embodiment of the wet etch comprises a vessel, a tetrahydrofurfuryl alcohol and potassium nitrite etching solution within the vessel, an electrode, a wafer support for positioning at least a portion of the silicon carbide wafer within the etching solution, and a voltage source coupled with the electrode and the wafer support. A second embodiment of the wet etch comprises a wafer carrier for holding at least one wafer, a polishing plate adjacent the wafer carrier, a voltage source having a first terminal electrically coupled with the wafer and a second terminal electrically coupled with the polishing plate, and an applicator adjacent the polishing plate for depositing an etching solution on a surface of the polishing plate.

4 Claims, 4 Drawing Sheets

FIG.5
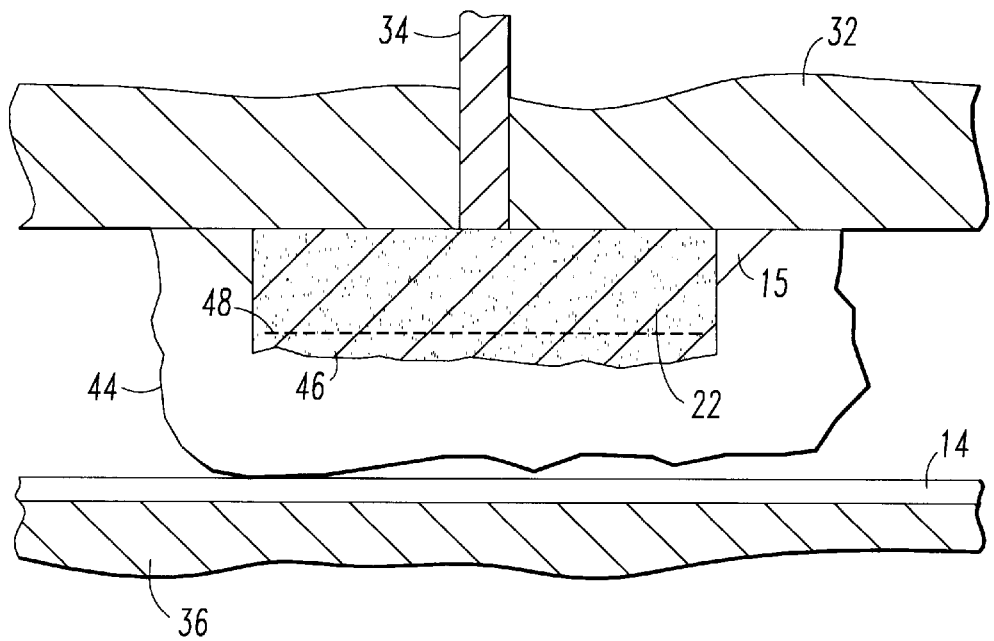
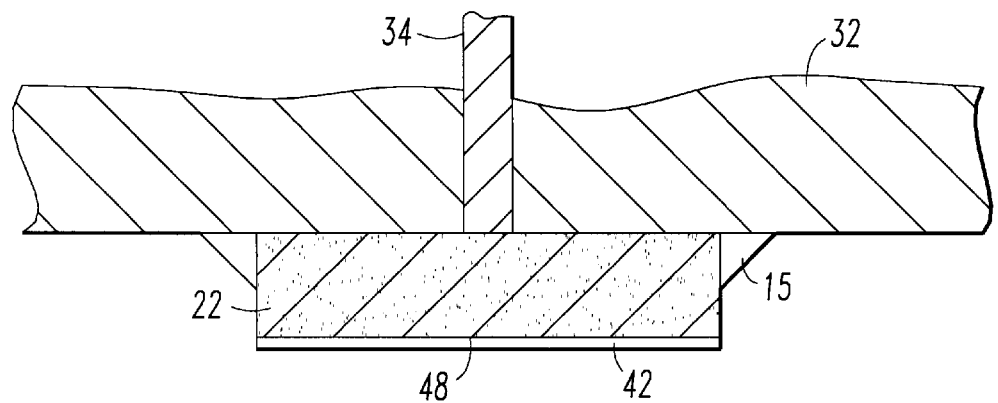
FIG.6

METHOD OF FABRICATING A SEMICONDUCTOR STRUCTURE

BACKGROUND OF THE INVENTION

1. Field of the Invention

This invention relates to wet etches, and more particularly to wet etches for shaping silicon carbide electronic microstructures, and polishing and shaping silicon carbide wafers and removing surface damage therefrom.

2. Description of the Prior Art

Silicon carbide (SiC) is a promising high power semiconductor material with microwave potential because of its high saturated electron velocity, high electric breakdown voltage and high maximum working temperature. The first two factors allow silicon carbide to be operated at high frequency and high electric energy density, respectively. The third factor allows operation in hot environments or higher levels of self-heating. Further, the rate in silicon carbide self heating is low because its high thermal conductivity makes removal of waste energy to thermal heat sinks particularly efficient.

Exploitation of silicon carbide semiconductors is now limited by the difficulty of growing large crystals, preparing high quality large diameter wafers and shaping the wafer surfaces into the final device shapes required.

This occurs because SiC has a mechanical hardness which approaches that of diamond and because there have been no damage free etches to remove the damage introduced by diamond cutting or reactive ion beam machining. One well known solution is high temperature (e.g., >1050° C.) oxidation followed by wet etch removal of the surface oxide that is formed. This process is difficult, expensive, limited in the depth that can be oxidized in a single step and can propogate damage back into previously undamaged SiC.

Wet etch is characterized by a chemical reaction between the solid semiconductor and chemicals dissolved in the liquid whereby the chemical bonds between atoms on the surface of the solid are altered in such a way that the altered surface atoms can themselves be dissolved and washed away. Etching can involve a single liquid or multiple liquids used sequentially, and additional agents to drive the reactions. Wet etches are low energy processes sensitive to surface chemistry and surface damage which do not create additional damage.

It is often desirable to identify the 6H c-axis faces (carbon and silicon) because each face yields different electrical and mechanical properties and different epitaxial growth behavior. Conventional methods of identification require oxidation at temperatures of 1150° C. for several hours to detect a relatively small difference in thermal oxidation rate.

Silicon carbide is a very hard material and is very difficult to cut and polish. Conventional methods of silicon carbide wafer preparation utilize diamond saws to cut rough silicon carbide wafers followed by high pressure diamond grit polishing to achieve mirror finish and plane parallel wafers. Further, direct polishing of a silicon carbide wafer with diamond removes silicon carbide damaged by cutting while introducing its own polishing damage.

Finally, it is well known in the state of the art that achieving the high electric energy densities (high breakdown voltage) predicted for SiC depends on removing damaged SiC surface material since that material acts as a low voltage breakdown path.

Therefore, there is a need for a wet etch usable with silicon carbide to prepare, polish and shape large diameter silicon carbide wafers.

SUMMARY OF THE INVENTION

The present invention provides for a wet etch and method for preparing a semiconductor device structure from a silicon carbide wafer. A first embodiment of the wet etch in accordance with the present invention comprises a vessel, a tetrahydrofurfuryl alcohol and potassium nitrite etching solution within the vessel and an electrode submersed within the tetrahydrofurfuryl alcohol and potassium nitrite etching solution. The wet etch additionally comprises a wafer support for positioning at least a portion of the silicon carbide wafer within the etching solution, and a voltage source coupled with the electrode and the wafer support.

The wet etch preferably includes a light emitter adjacent the vessel for improving the conductivity of the silicon carbide wafer. The preferred wet etch comprises a glass vessel, platinum electrode and carbon wafer support. The wafer support may comprise a tube for providing a vacuum to hold the silicon carbide wafer. The electrode and wafer support are oppositely biased.

A second embodiment of the wet etch in accordance with the present invention comprises a wafer carrier for holding at least one wafer, a polishing plate adjacent the wafer carrier, a voltage source having a first terminal electrically coupled with the wafer and a second terminal electrically coupled with the polishing plate, and an applicator adjacent the polishing plate for depositing an etching solution on a surface thereof adjacent the wafer.

The wet etch preferably includes a glass spacer intermediate the wafer carrier and the polishing plate, a first drive mechanism coupled with the wafer carrier for rotating the wafer carrier in a first direction, a second drive mechanism coupled with the polishing plate for rotating the polishing plate in a second direction opposite the first direction. The etching solution preferably comprises tetrahydrofurfuryl alcohol and potassium nitrite and diamond dust, and a light emitter may be positioned adjacent the wafer carrier for improving the conductivity of the wafer.

The electrolytic wet etch that is the subject of this invention has been shown to achieve these critical functions for SiC technology. The etch and etch process has been applied to damage removal and damage decoration in solid SiC crystal pieces. The deep room temperature oxidation achieved with this process decorates (highlights) grain boundaries, micropipes and different SiC polytypes so that the mass can be cleaned to yield the most perfect specimens for further characterization or as seeds for further crystal growth.

The electrolytic wet etch allows identification of the carbon and silicon faces to be achieved in a few minutes at room temperature while leaving a SiC surface below the electrolytic oxide of higher quality than can be achieved by high temperature oxidation.

The electrolytic anodization/etch described here consumes these damaged surface layers more effectively than the high temperature thermal oxidation process that is well known in the state of the art.

A complete understanding of the invention will be obtained from the following description and the accompanying figures.

BRIEF DESCRIPTION OF THE FIGURES

FIG. 5 is a cross-sectional view of the wet etch polishing an oxidized surface of the silicon carbide wafer.

FIG. 6 is a cross-sectional view of a polished silicon carbide wafer attached to a wafer carrier of the wet etch shown in FIG. 3.

DETAILED DESCRIPTION OF THE PREFERRED EMBODIMENTS

Although the present invention is described herein with reference to the preparation of semiconductor device structures from silicon carbide wafers, it is to be distinctly understood that the wet etch according to the present invention may be utilized to process wafers having other chemical compositions.

Figure 1:
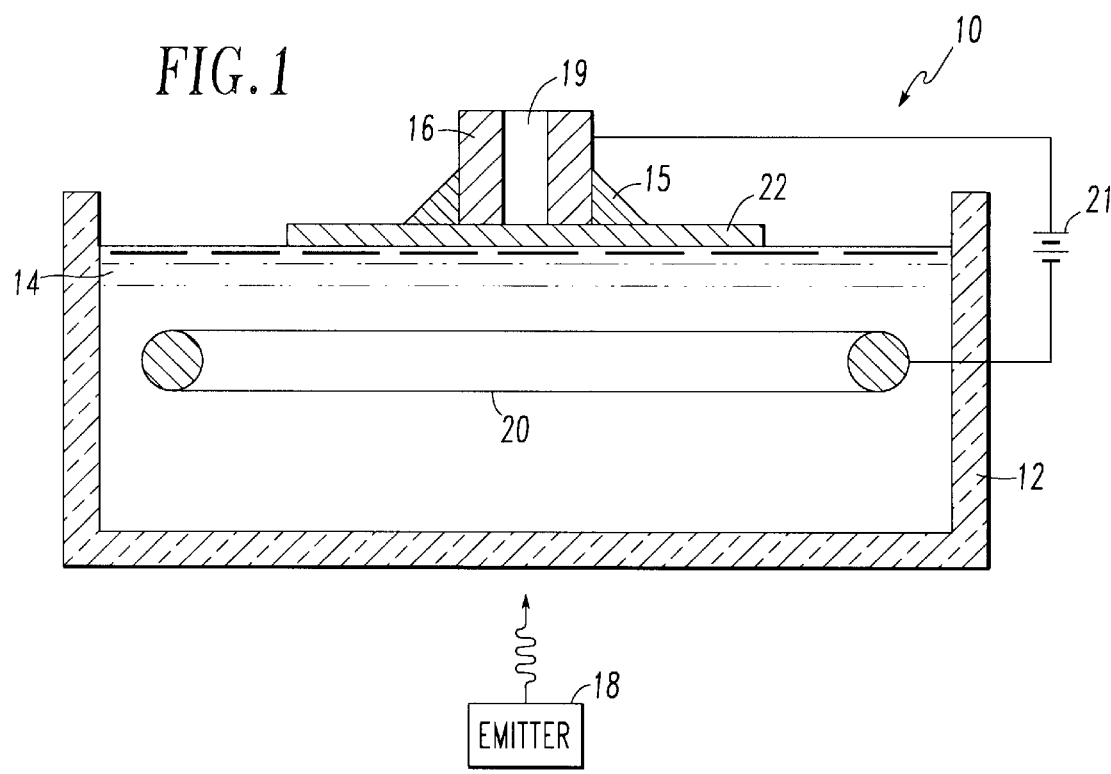
FIG. 1 is a cross-sectional view of an embodiment of the wet etch in accordance with the present invention.

Referring to FIG. 1, a first embodiment of the wet etch 10 in accordance with the present invention includes a glass vessel 12 which contains an etching solution 14. The etching solution 14 is preferably tetrahydrofurfuryl/alcohol saturated or approximately saturated with potassium nitrite (THFFA/KNO$_2$).

The etching solution 14 may be formed by initially saturating the THFFA by adding an excess of KNO$_2$. The liquid may be warmed, stirred and cooled to an operating temperature. It is understood that the decanted, cooled liquid may contain an excess of undissolved KNO$_2$ or be depleted below saturation as the electrolytic etch progresses. Further, although the etch is most easily performed at room temperature, it is understood that the liquid can be cooled or heated to achieve either better rate control or a faster rate as along as the liquid does not either solidify or evaporate.

The silicon carbide substrate 22 is placed in electrical contact with an electrically conducting head such as wafer support 16. The wafer support 16 may include an inner chamber 19 for providing a vacuum for holding the silicon carbide wafer adjacent the wafer support 16. Alternatively, a wax or conductive cement 15 may be utilized to hold the silicon carbide wafer 22 adjacent the wafer support 16. The wafer support 16 may comprise carbon.

A light emitter 18 may be preferably placed adjacent the glass vessel 12. In particular, the light emitter 18 can preferably be an ultraviolet light emitter to enhance electrical conduction in the silicon carbide wafer 22. The silicon carbide substrate 22 is almost always conducting and alternatively may be made conducting by exposing the wafer 22 to high energy, short wave length illumination from light emitter 18.

Silicon carbide is a wideband gap ($E_{gap} \cong 3$ electron volts) semiconductor that may act as an electrical insulator. No etching occurs if the silicon carbide wafer 22 acts an insulator. Short wavelength light (e.g., (wavelength<4500 Angstroms at the extreme violet end of the visible spectrum) excitation may be used to create electrical carriers to complete the circuit and allow the invention to function even with silicon carbide wafers 22 that are insulating in the absence of excitation.

The wet etch 10 in accordance with the present invention includes a negatively biased platinum electrode 20. A DC bias supplied by voltage source 21 may be applied to the wafer support 16 and platinum electrode 20 resulting in anodic oxide growth on the silicon carbide wafer 22 and gas evolution at the platinum electrode 20.

If this process is utilized with a silicon wafer instead of silicon carbide, approximately 5 Angstroms per volt of SiO$_2$ is grown and 2.5 Angstroms per volt of silicon is consumed for each volt of applied bias. The formed SiO$_2$ blocks current flow so that the current drops to zero and the process is self-limiting. The oxide is relatively poor quality compared to silicon's thermal oxide.

Applying a DC bias to a silicon carbide wafer results in anodic oxidation having more complex behavior than mere silicon. In particular, anodization leads to formation of some unknown combination of SiO$_x$ and CO$_x$ (or a very porous SiO$_x$ layer) such that the oxidation is not self-limiting and such that substantial material can be oxidized at modest voltages.

For example, in one experiment the carbon face of a 6H c-axis polished silicon carbide wafer 22 was anodized at 120 volts utilizing the wet etch 10 in accordance with the present invention. Utilizing a silicon carbide wafer 22, approximately 25,000 Angstroms (2.5 microns) of silicon carbide was consumed and approximately 100,000 Angstroms of dielectric was grown. In contrast, utilizing a silicon wafer, only 600 Angstroms of oxide can be grown while consuming only 300 Angstroms of silicon.

The high ratio of dielectric grown to material consumed while etching silicon carbide suggests a porous, low density dielectric was formed with continuing electrical current flow through the dielectric.

The wet etch 10 in accordance with the present invention may be utilized to etch silicon carbide in conjunction with masking layers for shaping electronic microstructures since two micrometer deep patterning is consistent with 100 GHz devices ($2 \times 10^{-4}$ cm/($2 \times 10^7$ cm/sec=V$_{sat}$)=$10^{-11}$ sec=1/100 GHz). Deeper features can be achieved by either increasing the supply voltage or by removing the anodic oxide in a chemical oxide etch such as hydroflouric acid repeating the anodic etch.

Similarly, if devices are fabricated on one face of the silicon carbide wafer 22, the wet etch 10 in accordance with the present invention can be employed from the opposite wafer surface to thin the wafers to their final thickness and/or utilized in conjunction with masking layers to create vias to the front surface.

Thinning of the wafers 22 does not require the use of a masking layer on the back surface of the wafer 22. Creating vias within the wafers 22 requires masking and repeated anodization etch/wet etch cycles to penetrate the wafer thickness which is typically 50 microns or more. The masking layer can be any electrically insulating material that is not dissolved by the THFFA/KNO$_2$ etching solution 14. Additionally, the masking layer is preferably not dissolved by chemical etches used to dissolve the anodic oxide. Known masking layers which may be utilized with the wet etch 10 in accordance with the present invention include silicon nitride or any one of a number of polyimides.

Devices may be fabricated onto or into either face (carbon and silicon) of the silicon carbide wafer 22. It is often important to identify each face of the silicon carbide wafer 22 inasmuch as the carbon and silicon faces yield different electrical and mechanical properties.

The rate of dielectric formation while utilizing the wet etch 10 in accordance with the present invention on the two 6H c-axis faces (carbon and silicon) can differ by a factor of ten or more with the carbon face yielding the higher rate. Therefore, the anodization technique of the present wet etch 10 is a fast technique for identifying the silicon and carbon faces of the silicon carbide wafer 22.

In particular, one end of the silicon carbide wafer 22 may be immersed directly into the etching solution 14. The oxidation rates of the first surface and the second surface will identify the silicon face and the carbon face.

The wet etch 10 also may be utilized as a fast process for removing rough cutting and/or lapping damage in order to obtain silicon carbide wafers 22 having an improved surface quality. Polishing a silicon wafer 22 with the wet etch 10 in accordance with the present invention removes cutting damage and leaves a flat surface without introducing significant damage itself. Removal of the rough damage makes a low damage final polish feasible since relatively little additional material is removed by the final polish. The final polish can be a conventional mechanical polish or preferably a second embodiment of the wet etch 10 discussed below which permits simultaneous wet etch anodization and mechanical polishing of the anodic oxide.

A surface of the silicon carbide wafer 22 may be oxidized in the wet etch 10. The silicon carbide wafer 22 may thereafter be removed from the wet etch 10 and the oxidized surface of the wafer 22 may be polished by diamond grit polishing to produce a flat polished surface without introducing significant damage. Removing the porous oxide with the diamond grit inflicts less damage upon the silicon carbide wafer compared with directly polishing the silicon carbide 22 with the diamond grit. Removal of the rough damage makes a low damage final polish feasible since relatively little additional material must be removed from the silicon carbide wafer 22.

Figure 2:
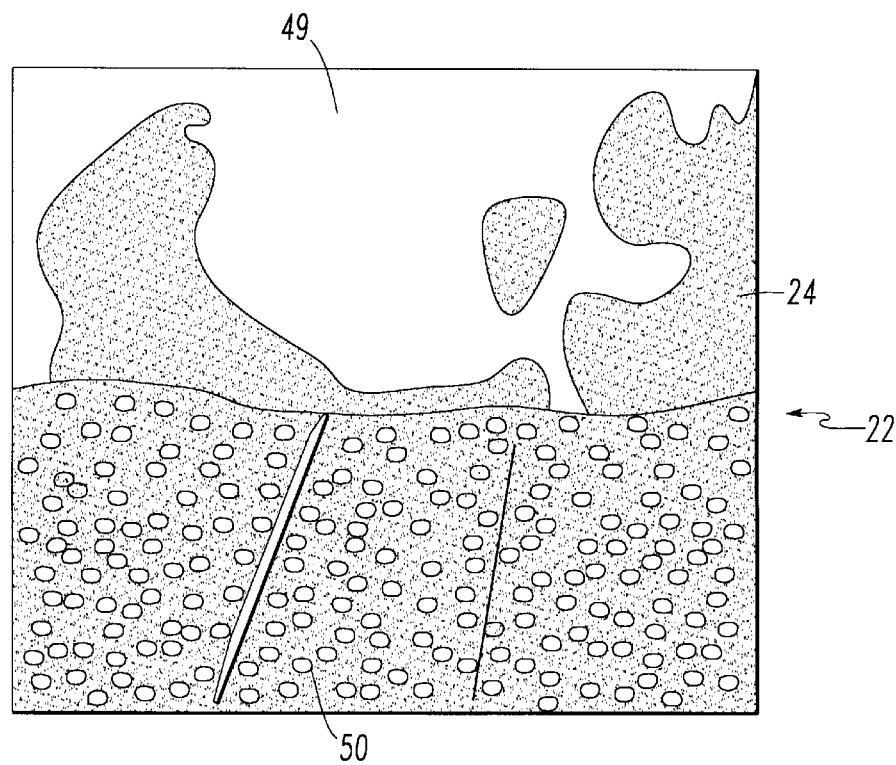
FIG. 2 is a top view of a silicon carbide wafer having a portion thereof anodized within the wet etch in accordance with the present invention.

FIG. 2 shows the result of anodizing a first half 24 of the silicon carbide wafer 22 in the tetrahydrofurfuryl/alcohol and potassium nitrite etching solution 14. The wafer support 16 may be modified to contact the silicon carbide wafer 22 perpendicularly on the perimeter thereof.

Referring to FIG. 2, a first half 24 of a 6H, C-axis C face of the silicon carbide wafer 22 was anodized at 60 volts for 30 minutes. The anodic oxide was subsequently etched off in hydrofluoric acid. The silicon carbide wafer 22 shows the "milky" surface of a polished, poor quality wafer along with spotty black defects and crystallite inclusions. The anodized first half 24 reveals that the black spot defects are micropipes 49 that extend through the silicon carbide wafer 22, the crystallites are on the opposite face and/or are not well resolved, and there is massive subsurface damage decorated by the anodization wet etch 10. The basic anodization depth is approximately 0.5 microns with decorated random polishing scratches 50 extending to a depth of 0.8 microns.

The tetrahydrofurfuryl/alcohol and potassium nitrite etch provides a fast process for removing rough cut, rough polish damage yielding silicon carbide wafers 22 having improved surface quality.

In addition, the wet etch 10 in accordance with the present invention may be utilized to identify highest quality seeds for silicon carbide crystal growth and to remove residual damage from those seeds. It is important to identify quality seeds and make sure the damage introduced in preparing the seed does not in fact degrade subsequent silicon carbide growth.

The wet etch 10 in accordance with the present invention removes the damage from the silicon carbide seeds, identifies the silicon and carbon faces of c-axis 6H seeds, and reveals micropipes which are the most common microscopic fault in current material.

Furthermore, the wet etch 10 clearly indicates if the seed is a single crystal inasmuch as the subcrystals are differentiated by their different oxidation rates.

As is well known in the state of the art, a seed crystal is a crystal specimen that will be used as a template for growing more of the same material. Under ideal conditions the final crystal is many times the volume of the seed and parts of the new crystal are actually superior to the seed because good technique and chance prevent seed defects from propagating into that part of the new growth. Nearly perfect material required for semiconductor manufacture is achieved by repeated growths and selection of the most defect free seed form that growth for the next growth. Common defects that must be excluded are inclusions of SiC with a different polytype, low angle grain boundaries between subcrystals of the desired polytype, micropipe voids and the ubiquitous cutting and polishing damage. This damage is particularly important since it is replicated in the new crystal and tends to make the bulk of the new crystal worse than the last and because the polishing damage can hide the former defects which will also be replicated in the new material even though they are not visible in the polished seed wafer.

Wet etch 10 is used in the selection of seed wafers to first remove all cutting and polishing damage by a deep anodic etch of both surfaces of potential seed wafers. Inspection after removal of the anodic oxide reveals inclusions of material with incorrect polytype by large changes in the anodic etch. Grain boundaries are typically decorated by a trench of greater anodic etch depth. Micropipes appear as open holes where the anodic etch preferentially removes the black debris often found in this common defect. All of the features made visible by the anodic etch 10 allow the crystal growth scientist to clear out the most perfect specimens as seeds for the next growth and to preserve the level of crystal quality that has been achieved.

A second embodiment of the wet etch 10 in accordance with the present invention may be utilized as a simultaneous etch-polish technique for silicon carbide. The silicon carbide wafer 22 can be polished using a diamond grit suspended in the tetrahydrofurfuryl/alcohol and potassium nitrite etching solution 14, and etched by electrically biasing the silicon carbide wafer 22 relative to a polishing plate 36. A surface of the silicon carbide wafer 22 is chemically oxidized and simultaneously polished to remove the oxide. Since this process relies on the diamond grit polishing $SiO_x$ oxide off of the silicon carbide wafer 22 rather than polishing off the silicon carbide itself, a much higher quality and faster polish is achieved.

Figure 3:
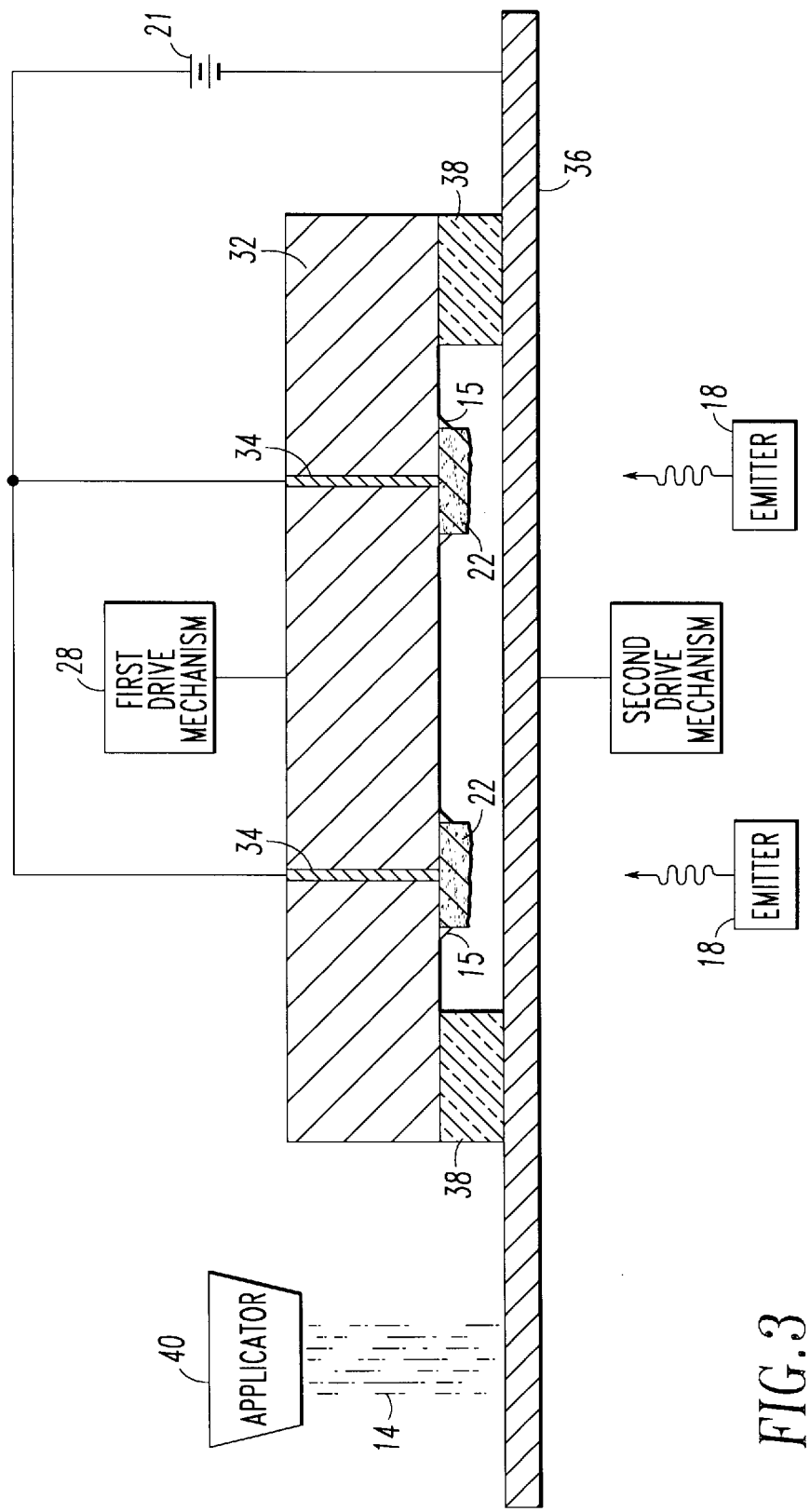
FIG. 3 is a cross-sectional view of a second embodiment of the wet etch in accordance with the present invention.

Referring to FIG. 3, one or more silicon carbide wafers 22 may be attached to a preferably circular insulating wafer carrier 32 of the wet etch 10. The silicon carbide wafers 22 may be attached to the carrier 32 by wax or conductive cement 15. The insulating wafer carrier 32 includes a plurality of electrodes 34 passing from an upper surface to the lower surface thereof. Each electrode 34 may be coupled with the positive terminal of a voltage source 21. The electrodes 34 are individually coupled with a respective silicon carbide wafer 22. The electrodes may comprise a liquid metal such as mercury, or a solid conductor. The negative terminal of the voltage source 21 is coupled with the conducting polishing plate 36.

At least one light emitter 18 may be preferably placed adjacent the wafer carrier 32. The silicon carbide substrate 22 is almost always conducting and alternatively may be made conducting by exposing the wafer 22 to high energy, short wave length illumination from light emitter 18.

The polishing plate 36 and insulating wafer carrier 32 preferably rotate in opposite directions. In particular, a first drive mechanism 28 may be coupled with the wafer carrier 32 for rotating the carrier 32 in a first direction. A second drive mechanism 29 may be coupled with the polishing plate 36 for rotating the preferably circular polishing plate 36 in a second direction opposite to that of the wafer carrier 32.

The polishing plate 36 and insulating wafer carrier 32 may be separated by a ring-shaped sacrificial insulating spacer 38. Spacer 38 may comprise glass or a hard plastic such as Bakelite™. The spacer 38 is subsequently worn down as the wafer 22 is polished.

An applicator 40 is located above the polishing plate 36 as shown in FIG. 3. The applicator 40 deposits the THFFA/$KNO_2$ etching solution 14 onto the polishing plate 36. The etching solution 14 forms a contact between the terminals of the voltage source 21 via polishing plate 36 and wafer 22.

The THFFA/$KNO_2$ etching solution 14 preferably contains diamond dust. The preferred concentration of diamond dust yields a suspension with the appearance of watery milk where the amount of diamond dust in suspension is controlled by agitation of applicator 40. Preferably, the surface of the wafer 22 to be polished rides on thousands of diamond particles per unit area without increasing the diamond concentration to the point where diamond particles ride on top of diamond particles.

The spacer 38 has a plurality of radial slots 41 passing from the outer diameter thereof to the inner diameter. The etching solution 14 deposited upon the polishing plate 36 passes through the slots and may form a meniscus beneath the insulating wafer carrier 32. The motion of the polishing plate 36 tends to spread and maintain the etching solution 14 over the entire upper surface of the polishing plate 36.

Figure 4:
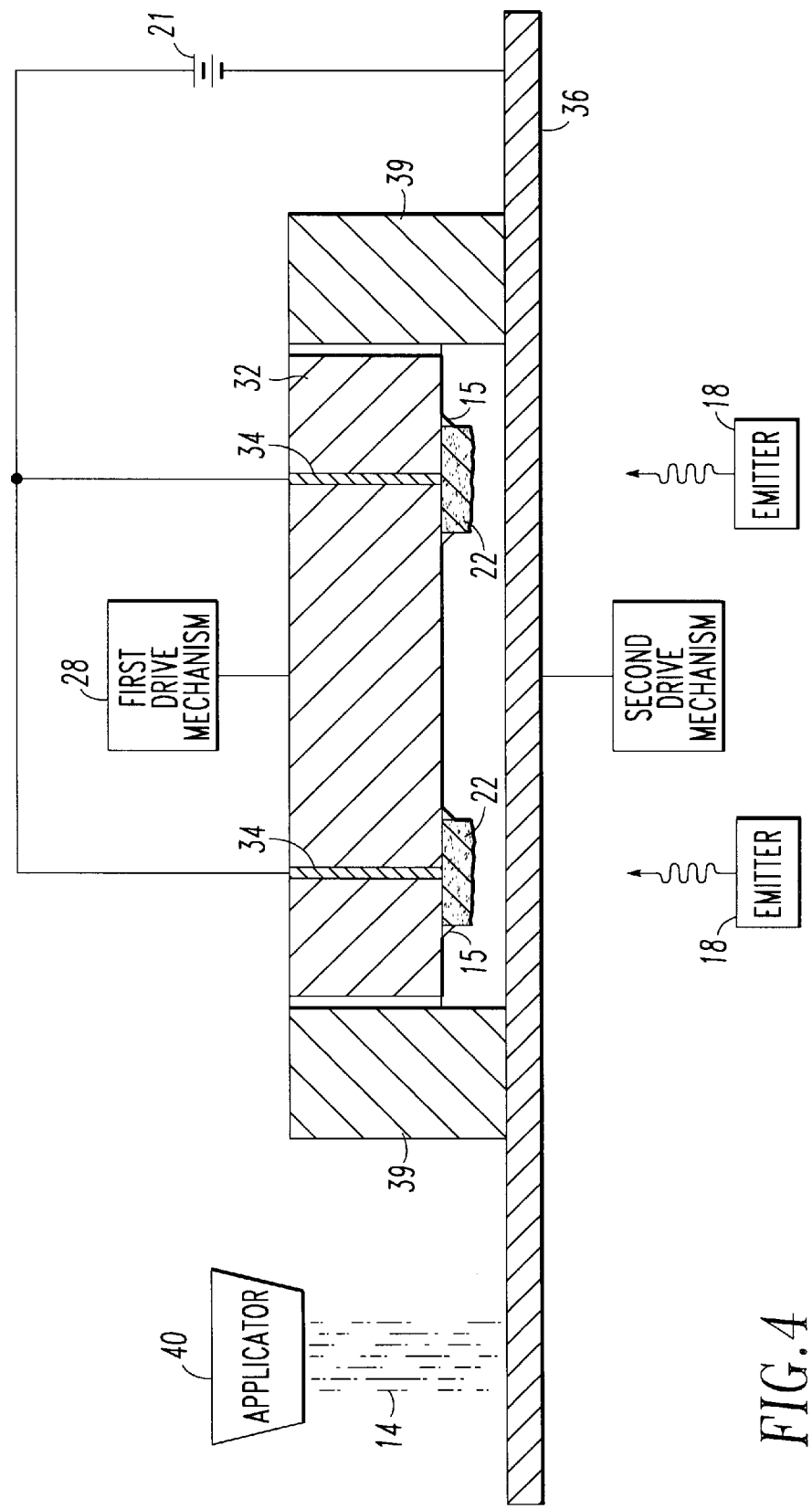
FIG. 4 is a cross-sectional view of a third embodiment of the wet etch in accordance with the present invention.

The embodiment shown in FIG. 4 is similar to the embodiment shown in FIG. 3. The wafer carrier 32 is a rigid insulating disk which fits inside a spacer cylinder 39. Cylinder 39 may be hardened steel. The weight of wafer carrier 32 and gravity automatically maintain a proper gap distance between the lower surface of each wafer 22 and the polishing plate 36. The carrier 32 is coupled with the first drive mechanism 28 for rotating the carrier 32 as previously discussed.

The polishing plate 36 and the wafer carrier 32 of the wet etches 10 shown in FIG. 3 and FIG. 4 may be separated by the thickness of the wafer 22 plus a few microns. The meniscus of etching solution 14 oxidizes the lower surface of the silicon carbide wafers 22. In addition, the diamond dust within the solution wears down the uneven portions of the wafer 22 which extend downward the furthest. More oxide is rapidly grown to replace the stripped oxide of the silicon carbide wafer 22. The diamond dust polishes the silicon carbide very slowly but rapidly polishes the porous $SiO_x$-$CO_x$ oxide in the region closest to the polishing plate 36.

Referring to FIG. 5, anodization results in the formation of a porous oxide layer 44 about the lower surface of the silicon carbide wafer 22. A portion 46 of the silicon carbide wafer 22 protruding therefrom, and almost exposed to the diamond grit, is rapidly oxidized while the porous oxide layer 44 is removed by the diamond grit. The porous oxide layer 44 is soft and prevents the diamond grit from damaging the unoxidized portion of the silicon carbide wafer 22.

The oxidized silicon carbide is easily removed by the diamond grit and eventually the surface of the silicon carbide wafer 22 is substantially plane-parallel with the insulating wafer carrier 32 as represented by dotted line 48 in FIG. 5 and as shown in FIG. 6. The smooth surface 48 of the polished silicon wafer 22 includes a thin residual oxide layer 42 (e.g., 1000 Angstroms) for protection until device fabrication or it can be subsequently removed by a wet etch in dilute solution of hydroflouric acid in water.

Alternatively, the silicon oxide wafer 22 may be dismounted and the polished side of the wafer 22 may be attached to the insulating wafer carrier 32. The etching-polishing process previously described may be repeated to polish the other side of the silicon carbide wafer 22.

While preferred embodiments of the invention have been shown and described herein, it will be appreciated by those skilled in the art that various modifications and alternatives to the disclosed embodiments may be developed in light of the overall teachings of the disclosure. Accordingly, the disclosed embodiments are meant to be illustrated only and not limiting to the scope of the invention which is to be given the full breadth of the following claims and all equivalents thereof.

I claim:

1. A method of fabricating a semiconductor device structure, comprising the steps of:

a. attaching at least one wafer to a wafer carrier;

b. providing an etching solution, containing a polishing powder, on a surface of a polishing plate adjacent said at least one wafer;

c. relatively rotating said wafer carrier and said polishing plate;

d. contacting a surface of said at least one wafer with said etching solution;

e. applying a voltage directly to said wafer relative to said polishing plate to form an oxide on said surface of said at least one wafer;

f. removing said oxide from said at least one wafer by means of contact with said polishing powder during said relative rotation of said wafer holder and said polishing plate; and g. continuing steps b to f until a desired smoothness of the wafer surface is achieved.

2. The method of claim 1 further comprising a step prior to step e of rotating said wafer carrier in a first direction and rotating said polishing plate in a second direction opposite said first direction.

3. The method of claim 1 wherein said etching solution comprises tetrahydrofurfuryl alcohol and potassium nitrite and diamond dust.

4. The method of claim 1 wherein said at least one wafer comprises silicon carbide.

\* \* \* \* \*